(12) United States Patent
Ding

(10) Patent No.: US 11,042,092 B2
(45) Date of Patent: Jun. 22, 2021

(54) FLEXIBLE SUBSTRATE AND MANUFACTURING METHOD OF SAME

(71) Applicant: WUHAN CHINA STAR OPTOELECTRONICS SEMICONDUCTOR DISPLAY TECHNOLOGY CO., LTD., Wuhan (CN)

(72) Inventor: Feng Ding, Wuhan (CN)

(*) Notice: Subject to any disclaimer, the term of this patent is extended or adjusted under 35 U.S.C. 154(b) by 0 days.

(21) Appl. No.: 16/642,025

(22) PCT Filed: Dec. 24, 2019

(86) PCT No.: PCT/CN2019/128082
§ 371 (c)(1),
(2) Date: Feb. 26, 2020

(87) PCT Pub. No.: WO2021/008083
PCT Pub. Date: Jan. 21, 2021

(65) Prior Publication Data
US 2021/0018842 A1    Jan. 21, 2021

(30) Foreign Application Priority Data

Jul. 16, 2019   (CN) .......................... 201910640984.2

(51) Int. Cl.
| | |
|---|---|
| *B32B 3/00* | (2006.01) |
| *G03F 7/20* | (2006.01) |
| *B32B 3/10* | (2006.01) |
| *B32B 3/18* | (2006.01) |
| *G03F 7/26* | (2006.01) |

(52) U.S. Cl.
CPC ................. *G03F 7/20* (2013.01); *B32B 3/00* (2013.01); *B32B 3/10* (2013.01); *B32B 3/18* (2013.01); *G03F 7/26* (2013.01); *B32B 2307/51* (2013.01); *B32B 2457/20* (2013.01)

(58) Field of Classification Search
CPC ...... H05K 1/0281; H05K 1/0393; G03F 7/20; G03F 7/26
See application file for complete search history.

(56) References Cited

U.S. PATENT DOCUMENTS

| | | | |
|---|---|---|---|
| 2004/0142108 A1* | 7/2004 | Atobe | ................... C23C 14/042 427/282 |
| 2019/0235665 A1 | 8/2019 | Kim et al. | |

(Continued)

FOREIGN PATENT DOCUMENTS

| | | |
|---|---|---|
| CN | 105320382 A | 2/2016 |
| CN | 106201088 A | 12/2016 |
| CN | 106876612 A | 6/2017 |

(Continued)

*Primary Examiner* — Elizabeth E Mulvaney

(57) ABSTRACT

The present application provides a flexible substrate and a manufacturing method of the flexible substrate. The flexible substrate includes a first flexible layer, a barrier layer, a second flexible layer, and a buffer layer. The barrier layer is disposed on a surface of the first flexible layer, the barrier layer includes a first bending resistant structure disposed therein, the second flexible layer is disposed on a surface of the barrier layer, the buffer layer is disposed on a surface of the second flexible layer, and the buffer layer includes a second bending resistant structure disposed therein.

20 Claims, 7 Drawing Sheets

(56) References Cited

U.S. PATENT DOCUMENTS

| | | | |
|---|---|---|---|
| 2019/0288016 A1* | 9/2019 | Gao | H01L 27/1262 |
| 2020/0194698 A1* | 6/2020 | Zhai | H01L 51/0097 |

FOREIGN PATENT DOCUMENTS

| | | |
|---|---|---|
| CN | 108257982 A | 7/2018 |
| CN | 108470738 A | 8/2018 |
| CN | 109378325 A | 2/2019 |
| CN | 109545801 A | 3/2019 |
| KR | 20190025799 A | 3/2019 |

\* cited by examiner

FLEXIBLE SUBSTRATE AND MANUFACTURING METHOD OF SAME

BACKGROUND OF INVENTION

Field of Invention

The present invention relates to the flexible display field, and particularly to a flexible substrate and a manufacturing method of the flexible substrate.

Description of Prior Art

In the prior art, flexible displays require a flexible substrate as a carrier of a flexible display element. Bending resistance and recovery of the flexible substrate directly affect performance and lifespan of the flexible displays. Therefore, it is necessary to provide a flexible substrate and a manufacturing method of the flexible substrate to improve the bending resistance and recovery of the flexible substrate.

SUMMARY OF INVENTION

The present application provides a flexible substrate and a manufacturing method of the flexible substrate to improve the bending resistance and recovery ability of the flexible substrate.

A flexible substrate comprises:

a first flexible layer;

a barrier layer formed on a surface of the first flexible layer, wherein the barrier layer comprises a first bending resistant structure formed therein, the first bending resistant structure is covered in the barrier layer;

a second flexible layer formed on a surface of the barrier layer; and a buffer layer formed on a surface of the second flexible layer, wherein the buffer layer comprises a second bending resistant structure formed therein, the second bending resistant structure is covered in the buffer layer.

In the flexible substrate of the present application, the first bending resistant structure comprises a first patterned structure, the second bending resistant structure comprises a second patterned structure.

In the flexible substrate of the present application, the first patterned structure and the second patterned structure are the same.

In the flexible substrate of the present application, an orthographic projection of the first patterned structure projected on the surface of the first flexible layer and an orthographic projection of the second patterned structure projected on the surface of the first flexible layer are coincident.

In the flexible substrate of the present application, the flexible substrate comprises a bending region and a non-bending region, the first bending resistant structure and the second bending resistant structure are located in the bending region.

In the flexible substrate of the present application, the first bending resistant structure comprises a plurality of first bar element structures, an extending direction of each first bar element structure and an extending direction of a bending line of the flexible substrate are vertical.

In the flexible substrate of the present application, the second bending resistant structure comprises a plurality of second bar element structures, an extending direction of each second bar element structure and an extending direction of a bending line of the flexible substrate are vertical.

In the flexible substrate of the present application, a thickness of the barrier layer is 400 nanometers-600 nanometers.

In the flexible substrate of the present application, a thickness of the first bending resistant structure is 100 nanometers-150 nanometers.

In the flexible substrate of the present application, a distance between a surface of the first bending resistant structure facing the first flexible layer and a surface of the barrier layer facing the first flexible layer is 150 nanometers-250 nanometers.

In the flexible substrate of the present application, a distance between a surface of the first bending resistant structure facing the first flexible layer and a surface of the barrier layer facing the second flexible layer is 200 nanometers-450 nanometers.

In the flexible substrate of the present application, a thickness of the buffer layer is 400 nanometers-600 nanometers.

In the flexible substrate of the present application, a thickness of the second bending resistant structure is 100 nanometers-150 nanometers.

In the flexible substrate of the present application, a distance between a surface of the second bending resistant structure facing the second flexible layer and a surface of the buffer layer facing the second flexible layer is 150 nanometers-250 nanometers.

In the flexible substrate of the present application, a distance between a surface of the second bending resistant structure facing the second flexible layer and a surface of the buffer layer facing away from the second flexible layer is 200 nanometers-450 nanometers.

A manufacturing method of a flexible substrate comprises:

providing a base substrate;

disposing a first flexible layer on the base substrate;

disposing a first barrier sub layer on the first flexible layer;

disposing a first bending resistant layer on the first barrier sub layer;

etching the first bending resistant layer to form a first bending resistant structure;

disposing a second barrier sub layer on the first bending resistant structure, wherein the first barrier sub layer and the second barrier sub layer are combined to form a barrier layer;

disposing a second flexible layer on the barrier layer;

disposing the first buffer sub layer on the second flexible layer;

disposing a second bending resistant layer on the first buffer sub layer;

etching the second bending resistant layer to form a second bending resistant structure;

disposing a second buffer sub layer on the second bending resistant structure, wherein the first buffer sub layer and the second buffer sub layer are combined to form a buffer layer; and removing the base substrate.

In the manufacturing method of the flexible substrate of the present application, the step of etching the first bending resistant layer to form a first bending resistant structure comprises:

providing a first mask, exposing and developing the first bending resistant layer; and etching the first bending resistant layer to form the first bending resistant structure;

wherein the step of etching the second bending resistant layer to form a second bending resistant structure comprises:

providing a second mask, exposing and developing the second bending resistant layer; and etching the second bending resistant layer to form the second bending resistant structure.

In the manufacturing method of the flexible substrate of the present application, the first mask and the second mask are the same mask.

In the manufacturing method of the flexible substrate of the present application, in the step of disposing a first bending resistant layer on the first barrier sub layer, a chemical vapor deposition method is used to dispose the first bending resistant layer on the first barrier sub layer in the reaction temperature of 230 degrees Celsius to 300 degrees Celsius.

In the manufacturing method of the flexible substrate of the present application, in the step of disposing a second bending resistant layer on the first buffer sub layer, a chemical vapor deposition method is used to dispose the second bending resistant layer on the first buffer sub layer in the reaction temperature of 230 degrees Celsius to 300 degrees Celsius.

The beneficial effect of this invention is: the present application provides a flexible substrate and a manufacturing method of the flexible substrate, the flexible substrate includes a first flexible layer, a barrier layer, a second flexible layer, and a buffer layer. The barrier layer is disposed on a surface of the first flexible layer, the barrier layer includes a first bending resistant structure disposed therein, the first bending resistant structure is covered in the barrier layer, the second flexible layer is disposed on a surface of the barrier layer, the buffer layer is disposed on a surface of the second flexible layer, the buffer layer includes a second bending resistant structure disposed therein, and the second bending resistant structure is covered in the buffer layer. By burying the first bending resistant structure in the barrier layer and burying the second bending resistant structure in the buffer layer, bending resistance characteristics of the first bending resistant structure and the second bending resistant structure are utilized, thereby improving bending resistance and recovery ability of the flexible substrate.

BRIEF DESCRIPTION OF DRAWINGS

In order to explain the technical solution in this application more clearly, the drawings used in the description of the embodiments are briefly introduced below. Obviously, the drawings in the following description are only some embodiments of the application. Those skilled in the art can also obtain other drawings based on these drawings without making creative labor.

DETAILED DESCRIPTION OF PREFERRED EMBODIMENTS

Figure 1:
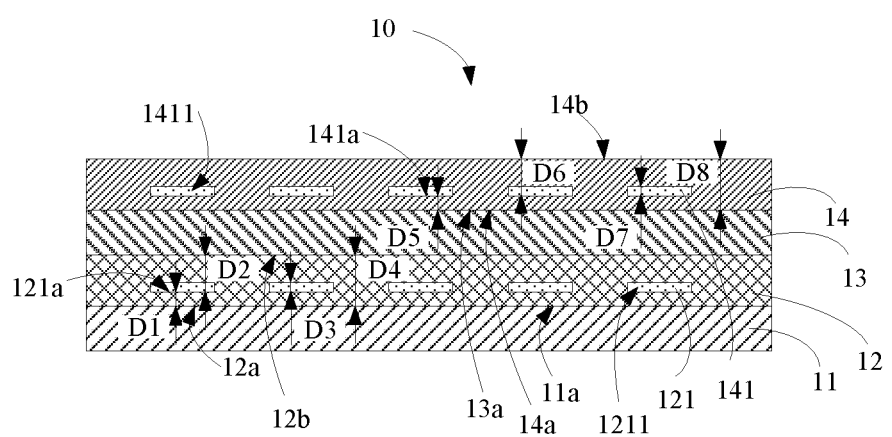
FIG. 1 is a cross-sectional view of a flexible substrate of one embodiment according to the present application.

Referring to FIG. 1, the present application provides a flexible substrate 10. The flexible substrate 10 includes a first flexible layer 11, a barrier layer 12, a second flexible layer 13, and a buffer layer 14. The first flexible layer 11, the barrier layer 12, the second flexible layer 13, and the buffer layer 14 are stacked in order. During a manufacturing process, the first flexible layer 11, the barrier layer 12, the second flexible layer 13, and the buffer layer 14 can be stacked in order on a base substrate, and after the manufacturing process, the base substrate can just be removed.

The first flexible layer 11 may be polyimide, cyclic olefin copolymer, polyterephthalic acid-based materials, and so on.

The barrier layer 12 is disposed on a surface 11a of the first flexible layer 11. The barrier layer 12 can be silicon nitride, silicon oxynitride, polyimide, or amorphous silicon. The barrier layer 12 includes a first bending resistant structure 121 formed therein. The first bending resistant structure 121 is covered in the barrier layer 12. The first bending resistant structure 121 is ethylene vinyl acetate copolymer (EVA), graphene, or nickel-based superalloys, and so on. The first bending resistant structure 121 includes a first patterned structure 1211. A distance D1 between a surface 121a of the first bending resistant structure 121 facing the first flexible layer 11 and a surface 12a of the barrier layer 12 facing the first flexible layer 11 is 150 nanometers-250 nanometers. In some embodiments, the distance D1 between the surface 121a of the first bending resistant structure 121 facing the first flexible layer 11 and the surface 12a of the barrier layer 12 facing the first flexible layer 11 can be 180 nanometers, 200 nanometers, or 230 nanometers. A distance D2 between the surface 121a of the first bending resistant structure 121 facing the first flexible layer 11 and a surface 12b of the barrier layer 12 facing the second flexible layer 13 is 200 nanometers-450 nanometers. In some embodiments, the distance D2 between the surface 121a of the first bending resistant structure 121 facing the first flexible layer 11 and the surface 12b of the barrier layer 12 facing the second flexible layer 13 can be 200 nanometers, 300 nanometers, or 400 nanometers. A thickness D3 of the first bending resistant structure 121 is 100 nanometers-150 nanometers. In some embodiments, the thickness D3 of the first bending resistant structure 121 can be 110 nanometers, 120 nanometers, or 140 nanometers. A thickness D4 of the barrier layer 12 is 400 nanometers-600 nanometers. In some embodiments, the thickness D4 of the barrier layer 12 can be 450 nanometers, 500 nanometers, or 550 nanometers.

The second flexible layer 13 is disposed on the surface 12b of the barrier layer 12. The second flexible layer 13 may be polyimide, cyclic olefin copolymer, polyterephthalic acid-based materials, and so on.

The buffer layer 14 is disposed on a surface 13a of the second flexible layer 13. The buffer layer 14 can be silicon nitride, silicon oxynitride, polyimide, or amorphous silicon, and so on. The buffer layer 14 includes a second bending resistant structure 141 formed therein. The second bending resistant structure 141 is covered in the buffer layer 14. The second bending resistant structure 141 is ethylene vinyl acetate copolymer (EVA), graphene, or nickel-based superalloys. The second bending resistant structure 141 includes a second patterned structure 1411. A distance D5 between a surface 141a of the second bending resistant structure 141 facing the second flexible layer 13 and a surface 14a of the buffer layer 14 facing the second flexible layer 13 is 150 nanometers-250 nanometers. In some embodiments, the distance D5 between the surface 141a of the second bending resistant structure 141 facing the second flexible layer 13 and the surface 14a of the buffer layer 14 facing the second flexible layer 13 can be 180 nanometers, 200 nanometers, or 230 nanometers. A distance D6 between the surface 141a of the second bending resistant structure 141 facing the second flexible layer 13 and a surface 14b of the buffer layer 14 facing away from the second flexible layer 13 is 200 nanometers-450 nanometers. In some embodiments, the distance D6 between a surface 141a of the second bending resistant structure 141 facing the second flexible layer 13 and the surface 14b of the buffer layer 14 facing away from the second flexible layer 13 can be 250 nanometers, 300 nanometers, or 400 nanometers. A thickness D7 of the second bending resistant structure 141 is 100 nanometers-150 nanometers. In some embodiments, the thickness D7 of the second bending resistant structure 141 can be 120 nanometers, 125 nanometers, or 140 nanometers. A thickness D8 of the buffer layer 14 is 400 nanometers-600 nanometers. In some embodiments, the thickness of the buffer layer can be 450 nanometers, 500 nanometers, or 550 nanometers.

Elastic modul of the first bending resistant structure and the second bending resistant structure are 2.5 GPa-3 GPa. Elongations of the first bending resistant structure and the second bending resistant structure are greater than 100%.

Figure 2:
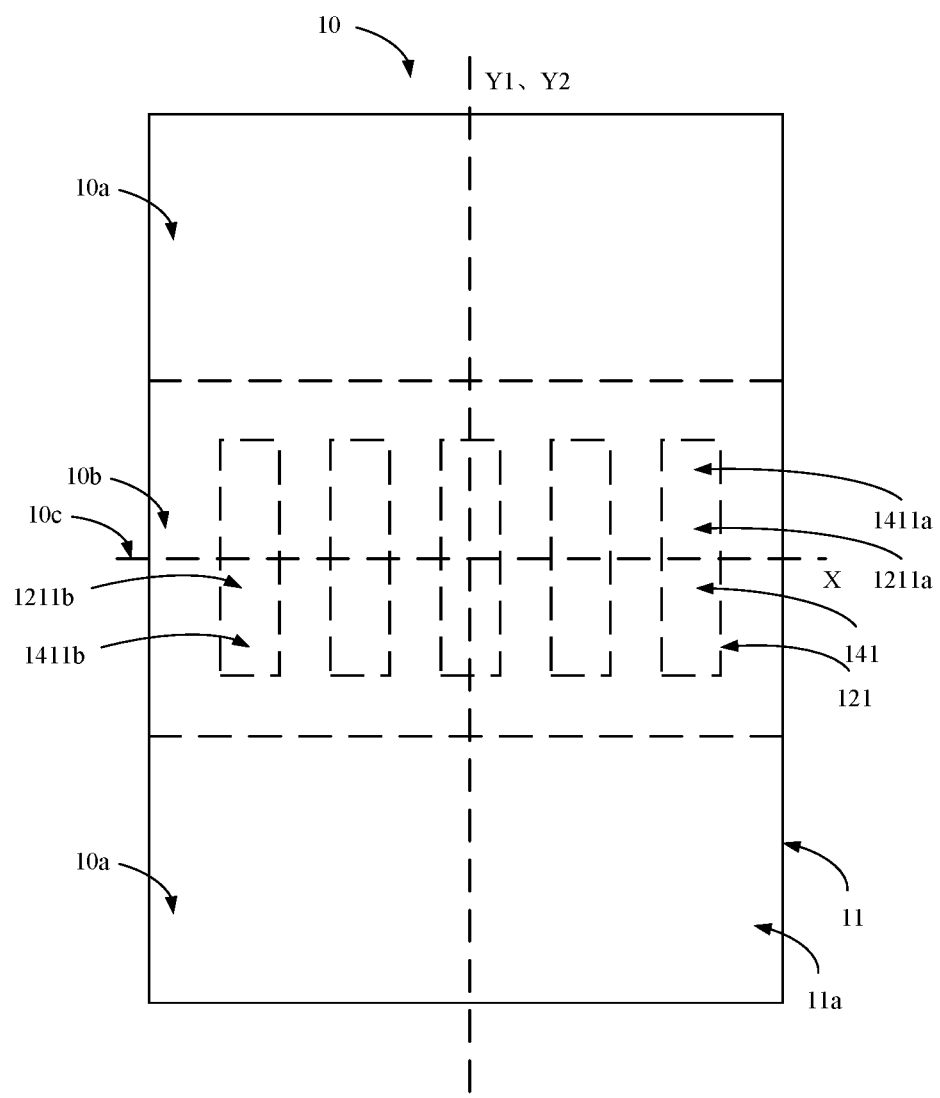
FIG. 2 is a top perspective of the flexible substrate of one embodiment according to the present application.

Referring to FIG. 2, the first patterned structure 1211 and the second patterned structure 1411 are the same. An orthographic projection 1211a of the first patterned structure 1211 projected on the surface 11a of the first flexible layer 11 and an orthographic projection 1411a of the second patterned structure 1411 projected on the surface 11a of the first flexible layer 11 are coincident. The flexible substrate 10 includes a bending region 10a and non-bending region 10b. The first bending resistant structure 121 and the second bending resistant structure 141 are disposed in the bending region 10b. The first bending resistant structure 121 includes a plurality of first bar element structures 1211b. An extending direction Y1 of each first bar element structure 1211b and an extending direction X of a bending line 10c of the flexible substrate 10 are vertical. The second bending resistant structure 141 comprises a plurality of second bar element structures 1411b. An extending direction Y2 of each second bar element structure 10 and the extending direction X of the bending line 10c of the flexible substrate 10 are vertical. The flexible substrate 10 can withstand bending of more than 200,000 times.

Figure 3:
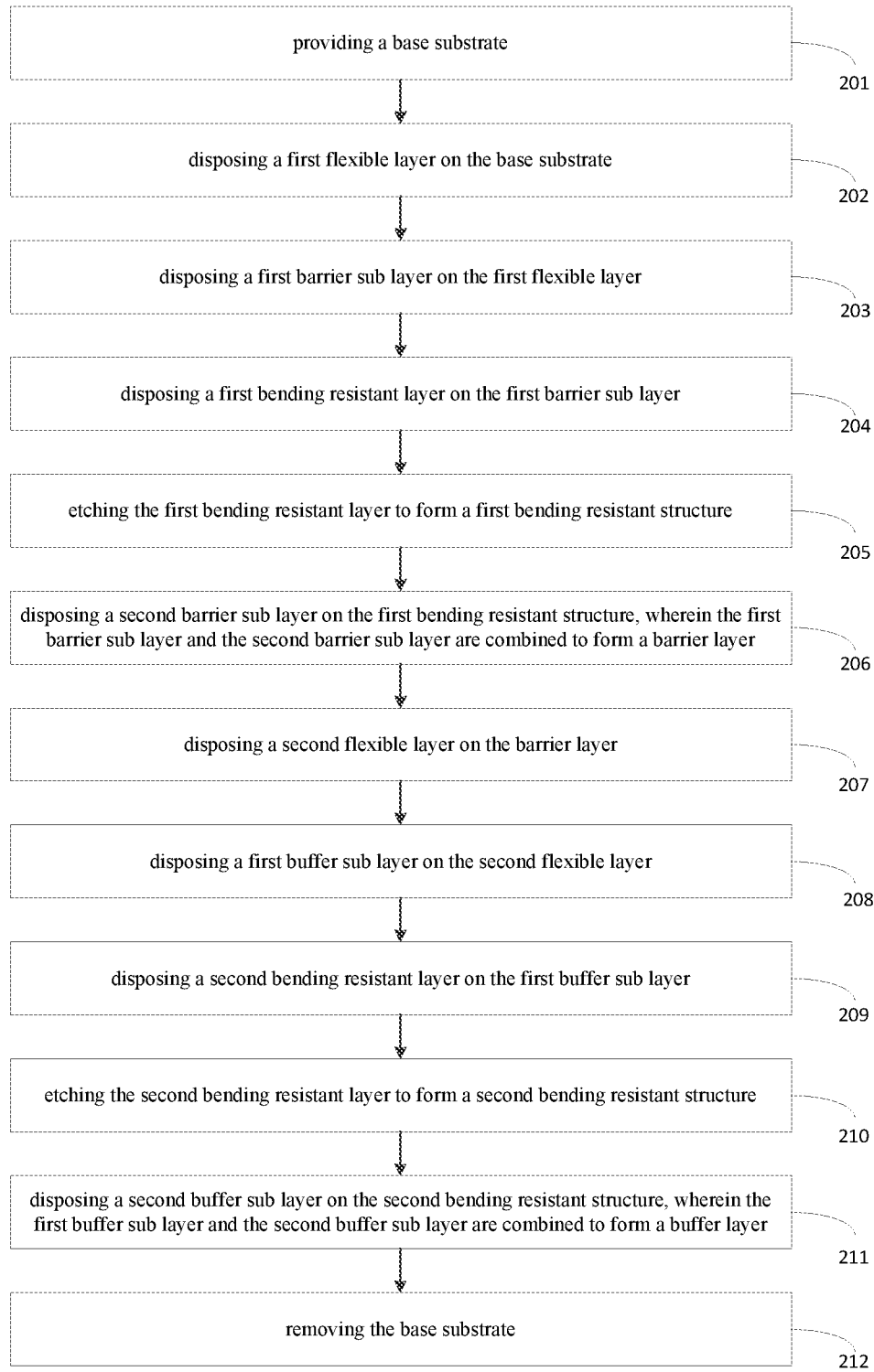
FIG. 3 is a flow chart of a manufacturing method of the flexible substrate of one embodiment according to the present application.

Referring to FIG. 3, the present application also provides a manufacturing method of the flexible substrate, which includes:

A step 201 of providing a base substrate 30.

Figure 4:
FIG. 4 is a cross-sectional view of a first intermediate product of the manufacturing method of the flexible substrate of one embodiment according to the present application.

Referring to FIG. 4, the base substrate 30 can be a flexible substrate or a glass substrate.

A step 202 of disposing a first flexible layer 11 of the base substrate 30.

Figure 5:
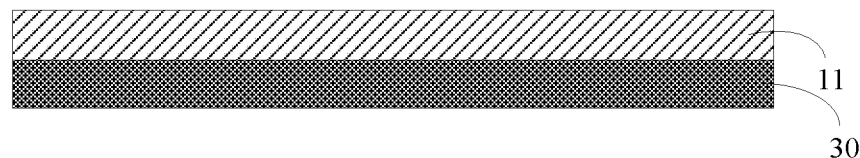
FIG. 5 is a cross-sectional view of a second intermediate product of the manufacturing method of the flexible substrate of one embodiment according to the present application.

Referring to FIG. 5, the first flexible layer 11 may be polyimide, cyclic olefin copolymer, polyterephthalic acid-based materials, and so on.

A step 203 of disposing a first barrier sub layer 1201 on the first flexible layer 11.

Figure 6:
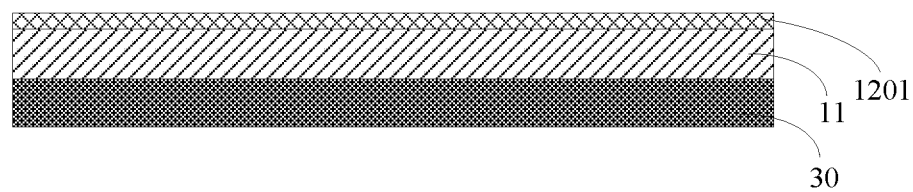
FIG. 6 is a cross-sectional view of a third intermediate product of the manufacturing method of the flexible substrate of one embodiment according to the present application.

Referring to FIG. 6, the first barrier sub layer 1201 can be silicon nitride, silicon oxynitride, polyimide, or amorphous silicon, and so on. A thickness of the first barrier sub layer 1201 is 150 nanometers-250 nanometers.

A step 204 of disposing a first bending resistant layer 1210 on the first barrier sub layer 1201.

Figure 7:
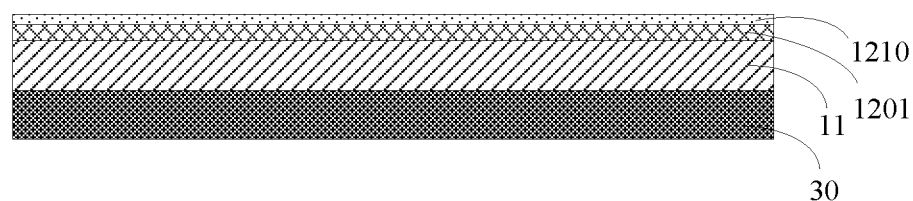
FIG. 7 is a cross-sectional view of a fourth intermediate product of the manufacturing method of the flexible substrate of one embodiment according to the present application.

Referring to FIG. 7, a chemical vapor deposition method is used to dispose the first bending resistant layer 1210 on the first barrier sub layer 1201 when a reaction temperature is 230 degrees Celsius to 300 degrees Celsius. The first bending resistant layer 1210 is ethylene vinyl acetate copolymer (EVA), graphene, or nickel-based superalloys, and so on. A thickness of the first bending resistant layer 1210 is 100 nanometers-150 nanometers.

A step 205 of etching the first bending resistant layer 1210 to form the first bending resistant structure 121.

Figure 8:
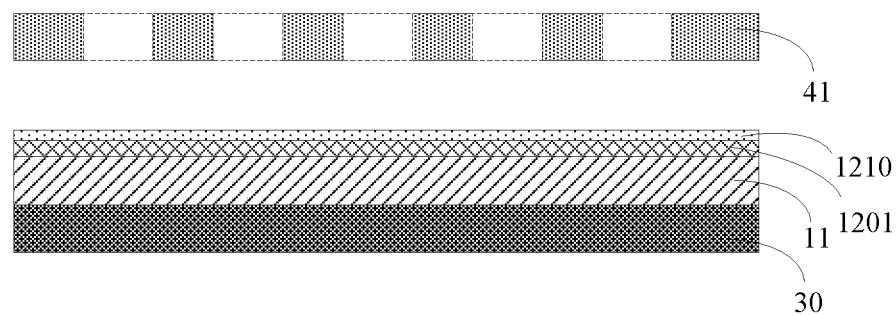
FIG. 8 is a cross-sectional view of a fifth intermediate product of the manufacturing method of the flexible substrate of one embodiment according to the present application.
Figure 9:
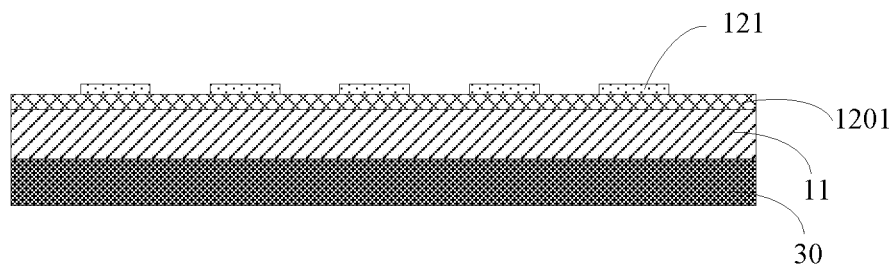
FIG. 9 is a cross-sectional view of a sixth intermediate product of the manufacturing method of the flexible substrate of one embodiment according to the present application.

Referring to FIGS. 8 and 9, a first mask 41 is provided, the first bending resistant layer 1210 is exposed and developed, and then the first bending resistant layer 1210 is etched to form the first bending resistant structure 121.

A step 206 of disposing a second barrier sub layer 1202 on the first bending resistant structure 121, wherein the first barrier sub layer 1201 and the second barrier sub layer 1202 are combined to form a barrier layer 12.

Figure 10:
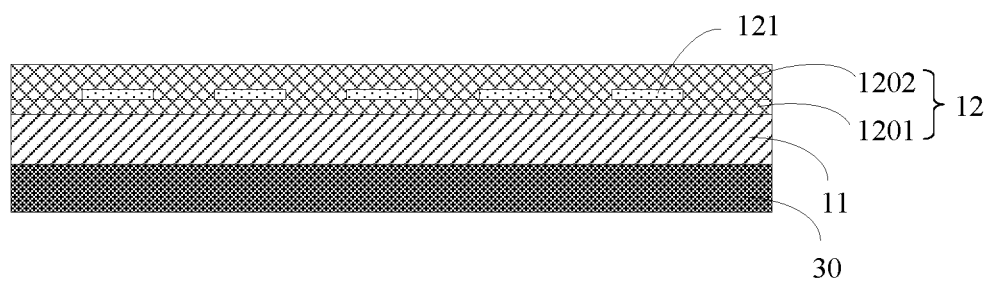
FIG. 10 is a cross-sectional view of a seventh intermediate product of the manufacturing method of the flexible substrate of one embodiment according to the present application.

Referring to FIG. 10, the second barrier sub layer 1202 can be silicon nitride, silicon oxynitride, polyimide, or amorphous silicon, and so on. A thickness of second barrier sub layer 1202 is 200 nanometers-450 nanometers. A thickness of the barrier layer 12 is 400 nanometers-600 nanometers. In one embodiment, material of the first barrier sub layer 1201 and material of the second barrier sub layer 1202 are the same.

A step 207 of disposing a second flexible layer 13 on the barrier layer 12.

Figure 11:
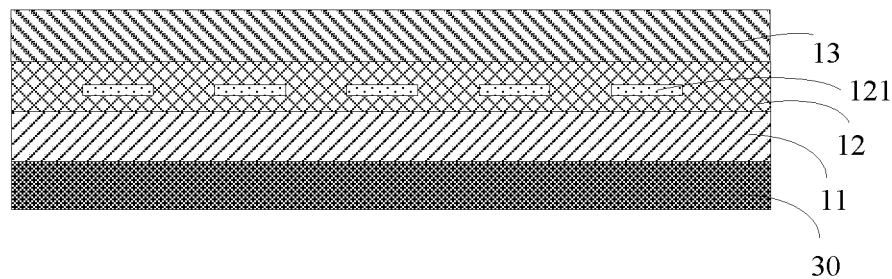
FIG. 11 is a cross-sectional view of an eighth intermediate product of the manufacturing method of the flexible substrate of one embodiment according to the present application.

Referring to FIG. 11, the second flexible layer 13 may be polyimide, cyclic olefin copolymer, polyterephthalic acid-based materials, and so on.

A step 208 of disposing the first buffer sub layer 1401 on the second flexible layer 13.

Figure 12:
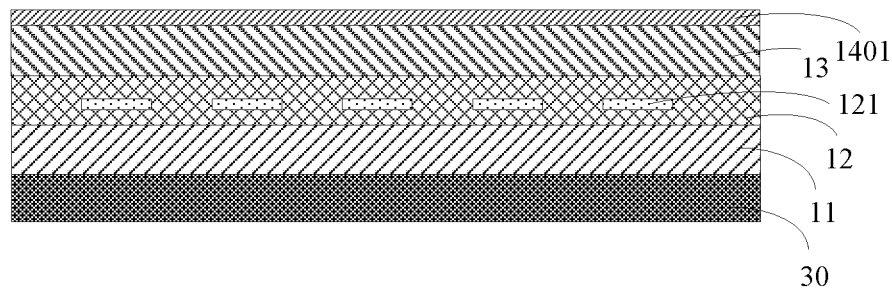
FIG. 12 is a cross-sectional view of a ninth intermediate product of the manufacturing method of the flexible substrate of one embodiment according to the present application.

Referring to FIG. 12, the first buffer sub layer 1401 can be silicon nitride, silicon oxynitride, polyimide, or amorphous silicon, and so on. A thickness of the first buffer sub layer 1401 is 150 nanometers-250 nanometers.

A step 209 of disposing a second bending resistant layer 1410 on the first buffer sub layer 1401.

Figure 13:
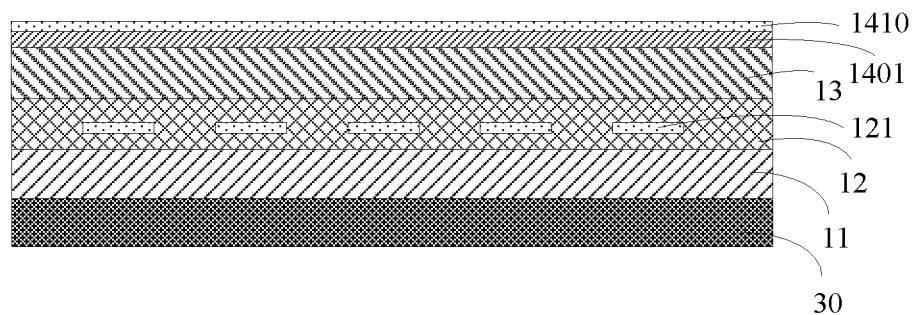
FIG. 13 is a cross-sectional view of a tenth intermediate product of the manufacturing method of the flexible substrate of one embodiment according to the present application.

Referring to FIG. 13, a chemical vapor deposition method is used to dispose the second bending resistant layer 1410 on the first buffer sub layer 1401 when a reaction temperature is 230 degrees Celsius to 300 degrees Celsius. The second bending resistant layer 1410 is ethylene vinyl acetate copolymer (EVA), graphene, or nickel-based superalloys, and so on. A thickness of the second bending resistant layer 1410 is 100 nanometers-150 nanometers.

A step 210 of etching the second bending resistant layer 1410 to form a second bending resistant structure 141.

Figure 14:
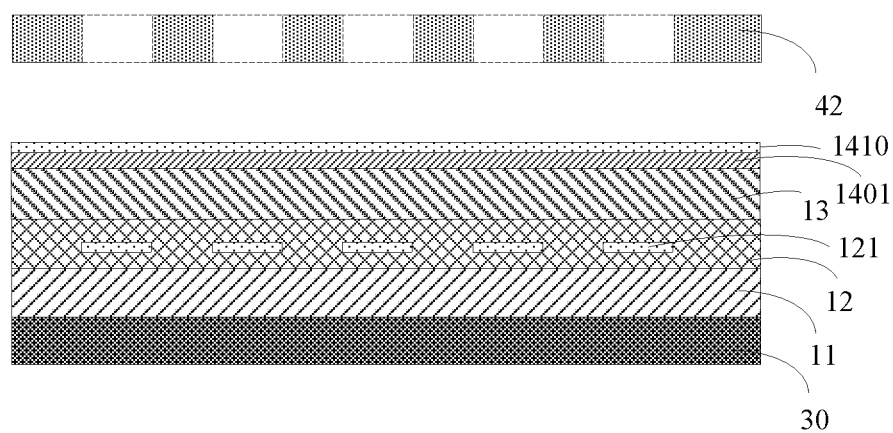
FIG. 14 is a cross-sectional view of an eleventh intermediate product of the manufacturing method of the flexible substrate of one embodiment according to the present application.
Figure 15:
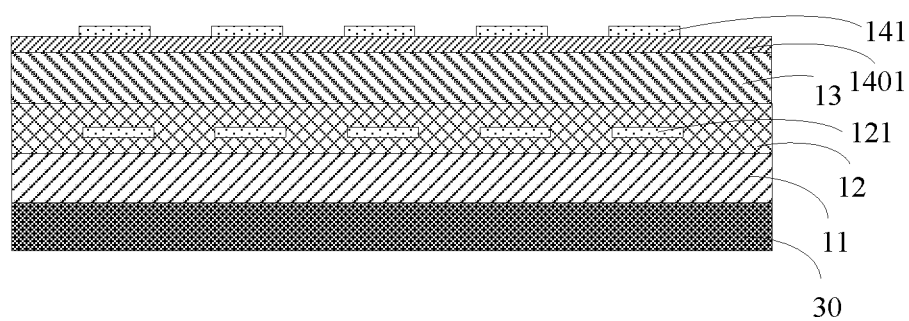
FIG. 15 is a cross-sectional view of a twelfth intermediate product of the manufacturing method of the flexible substrate of one embodiment according to the present application.

Referring to FIGS. 14 and 15, a second mask 42 is provided, the second bending resistant layer 1410 is exposed and developed, and then the second bending resistant layer 1410 is etched to form the second bending resistant structure 141. In order to simplify the process, the first mask 41 and the second mask 42 are the same mask.

A step 211 of disposing a second buffer sub layer 1402 on the second bending resistant structure 141, wherein the first buffer sub layer 1401 and the second buffer sub layer 1402 are combined to form a buffer layer 14.

Figure 16:
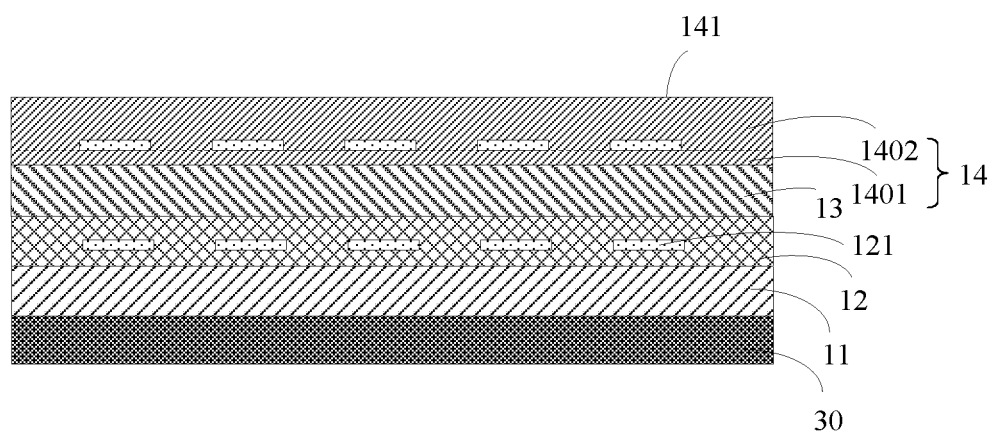
FIG. 16 is a cross-sectional view of a thirteenth intermediate product of the manufacturing method of the flexible substrate of one embodiment according to the present application.

Referring to FIG. 16, the second buffer sub layer 1402 can be silicon nitride, silicon oxynitride, polyimide, or amorphous silicon, and so on. A thickness of the second buffer sub layer 1402 is 200 nanometers-450 nanometers. A thickness of the buffer layer 14 is 400 nanometers-600 nanometers. In one embodiment, material of the first buffer sub layer 1401 and material of the second buffer sub layer 1402 are the same.

A step 212 of removing the base substrate.

Figure 17:
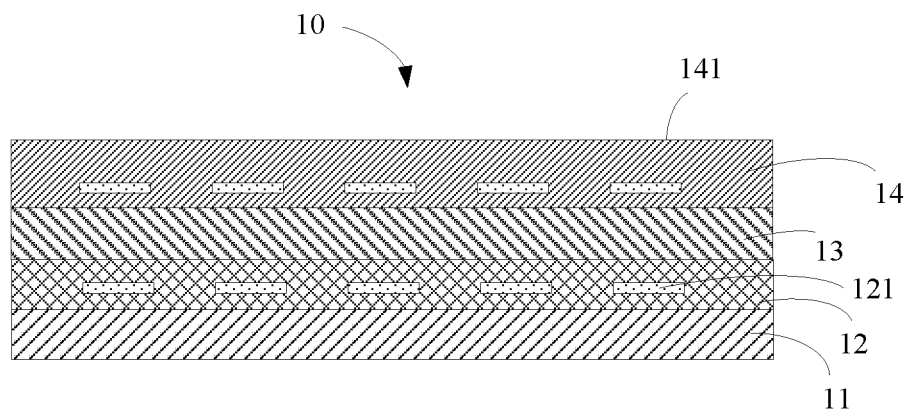
FIG. 17 is a cross-sectional view of the flexible substrate of the manufacturing method of the flexible substrate of one embodiment according to the present application.

Referring to FIG. 17, the base substrate 30 is removed to obtain the flexible substrate 10.

The present application provides a flexible substrate and a manufacturing method of the flexible substrate. The flexible substrate includes a first flexible layer, a barrier layer, a second flexible layer, and a buffer layer. The barrier layer is disposed on a surface of the first flexible layer, the barrier layer includes a first bending resistant structure disposed therein, the first bending resistant structure is covered in the barrier layer, the second flexible layer is disposed on a surface of the barrier layer, the buffer layer is disposed on a surface of the second flexible layer, the buffer layer includes a second bending resistant structure disposed therein, and the second bending resistant structure is covered in the buffer layer. By burying the first bending resistant structure in the barrier layer and burying the second bending resistant structure in the buffer layer, bending resistance characteristics of the first bending resistant structure and the second bending resistant structure are utilized, thereby improving bending resistance and recovery ability of the flexible substrate.

The embodiments of the present application have been described in detail above. Specific examples have been used herein to explain the principles and embodiments of the present application. The description of the above embodiments is only to help understand the application. At the same time, for those skilled in the art, according to the idea of this application, there will be changes in the specific implementation and scope of application. In summary, the content of this specification should not be understood as a limitation on this application.

What is claimed is:

1. A flexible substrate, comprising:
a first flexible layer;
a barrier layer formed on a surface of the first flexible layer, wherein the barrier layer comprises a first bending resistant structure formed therein, the first bending resistant structure is covered in the barrier layer, and top and bottom surfaces of the first bending resistant structure are in direct contact with the barrier layer;
a second flexible layer formed on a surface of the barrier layer; and
a buffer layer formed on a surface of the second flexible layer, wherein the buffer layer comprises a second bending resistant structure formed therein, and the second bending resistant structure is covered in the buffer layer.

2. The flexible substrate of claim 1, wherein the first bending resistant structure comprises a first patterned structure, and the second bending resistant structure comprises a second patterned structure.

3. The flexible substrate of claim 2, wherein the first patterned structure and the second patterned structure are same.

4. The flexible substrate of claim 3, wherein an orthographic projection of the first patterned structure projected on the surface of the first flexible layer and an orthographic projection of the second patterned structure projected on the surface of the first flexible layer are coincident.

5. The flexible substrate of claim 1, wherein the flexible substrate comprises a bending region and a non-bending region, and the first bending resistant structure and the second bending resistant structure are located in the bending region.

6. The flexible substrate of claim 5, wherein the first bending resistant structure comprises a plurality of first bar element structures, and an extending direction of each first bar element structure and an extending direction of a bending line of the flexible substrate are vertical.

7. The flexible substrate of claim 5, wherein the second bending resistant structure comprises a plurality of second bar element structures, and an extending direction of each second bar element structure and an extending direction of a bending line of the flexible substrate are vertical.

8. The flexible substrate of claim 1, wherein a thickness of the barrier layer is 400 nanometers-600 nanometers.

9. The flexible substrate of claim 1, wherein a thickness of the first bending resistant structure is 100 nanometers-150 nanometers.

10. The flexible substrate of claim 1, wherein a distance between a surface of the first bending resistant structure facing the first flexible layer and a surface of the barrier layer facing the first flexible layer is 150 nanometers-250 nanometers.

11. The flexible substrate of claim 1, wherein a distance between a surface of the first bending resistant structure facing the first flexible layer and a surface of the barrier layer facing the second flexible layer is 200 nanometers-450 nanometers.

12. The flexible substrate of claim 1, wherein a thickness of the buffer layer is 400 nanometers-600 nanometers.

13. The flexible substrate of claim 1, wherein a thickness of the second bending resistant structure is 100 nanometers-150 nanometers.

14. The flexible substrate of claim 1, wherein a distance between a surface of the second bending resistant structure facing the second flexible layer and a surface of the buffer layer facing the second flexible layer is 150 nanometers-250 nanometers.

15. The flexible substrate of claim 1, wherein a distance between a surface of the second bending resistant structure facing the second flexible layer and a surface of the buffer layer facing away from the second flexible layer is 200 nanometers-450 nanometers.

16. A manufacturing method of a flexible substrate, comprising following steps:
   providing a base substrate;
   disposing a first flexible layer on the base substrate;
   disposing a first barrier sub layer on the first flexible layer;
   disposing a first bending resistant layer on the first barrier sub layer;
   etching the first bending resistant layer to form a first bending resistant structure;
   disposing a second barrier sub layer on the first bending resistant structure, wherein the first barrier sub layer and the second barrier sub layer are combined to form a barrier layer, and top and bottom surfaces of the first bending resistant structure are in direct contact with the barrier layer;
   disposing a second flexible layer on the barrier layer;
   disposing a first buffer sub layer on the second flexible layer;
   disposing a second bending resistant layer on the first buffer sub layer;
   etching the second bending resistant layer to form a second bending resistant structure;
   disposing a second buffer sub layer on the second bending resistant structure, wherein the first buffer sub layer and the second buffer sub layer are combined to form a buffer layer; and
   removing the base substrate.

17. The manufacturing method of the flexible substrate of claim 16, wherein the step of etching the first bending resistant layer to form the first bending resistant structure comprises:
   providing a first mask, exposing and developing the first bending resistant layer; and
   etching the first bending resistant layer to form the first bending resistant structure; and
   wherein the step of etching the second bending resistant layer to form the second bending resistant structure comprises:
   providing a second mask, exposing and developing the second bending resistant layer; and
   etching the second bending resistant layer to form the second bending resistant structure.

18. The manufacturing method of the flexible substrate of claim 17, wherein the first mask and the second mask are a same mask.

19. The manufacturing method of the flexible substrate of claim 17, wherein in the step of disposing the first bending resistant layer on the first barrier sub layer, a chemical vapor deposition method is used to dispose the first bending resistant layer on the first barrier sub layer when a reaction temperature is 230 degrees Celsius to 300 degrees Celsius.

20. The manufacturing method of the flexible substrate of claim 17, wherein in the step of disposing the second bending resistant layer on the first buffer sub layer, a chemical vapor deposition method is used to dispose the second bending resistant layer on the first buffer sub layer when a reaction temperature is 230 degrees Celsius to 300 degrees Celsius.

* * * * *